United States Patent
Yamada et al.

(10) Patent No.: US 6,931,701 B2
(45) Date of Patent: Aug. 23, 2005

(54) METHOD FOR MANUFACTURING A THIN FILM

(75) Inventors: Hajime Yamada, Otsu (JP); Masaki Takeuchi, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 373 days.

(21) Appl. No.: 10/338,709

(22) Filed: Jan. 9, 2003

(65) Prior Publication Data

US 2003/0141788 A1 Jul. 31, 2003

Related U.S. Application Data

(62) Division of application No. 09/874,713, filed on Jun. 5, 2001, now abandoned.

(30) Foreign Application Priority Data

Jul. 19, 2000 (JP) ........................................ 2000-219619

(51) Int. Cl.[7] .................... H04R 17/00; H01L 41/04; H01L 41/08; H01L 41/18; H01L 2/00
(52) U.S. Cl. ........................ 29/25.35; 29/594; 29/846; 310/311; 204/192.18
(58) Field of Search .................... 29/25.35, 846, 29/594; 310/311; 204/192.18, 192.2, 192.22, 192.23, 192.16

(56) References Cited

U.S. PATENT DOCUMENTS

| | | | | |
|---|---|---|---|---|
| 4,961,820 A | * | 10/1990 | Shinagawa et al. | 438/725 |
| 5,370,299 A | | 12/1994 | Tanabe et al. | |
| 5,429,731 A | * | 7/1995 | Osano et al. | 204/192.2 |
| 5,516,027 A | | 5/1996 | Tanabe et al. | |
| 5,652,037 A | * | 7/1997 | Ohkawa et al. | 428/64.1 |
| 6,033,537 A | * | 3/2000 | Suguro | 204/192.2 |
| 6,045,626 A | * | 4/2000 | Yano et al. | 148/33.4 |

FOREIGN PATENT DOCUMENTS

| | | | |
|---|---|---|---|
| EP | 1 106 708 A2 | 6/2001 | |
| JP | 62-214167 | 9/1987 | |
| JP | 03-140684 | * 11/1992 | ............ H03H/9/25 |
| JP | 4-341005 | 11/1992 | |
| JP | 7-316809 | 12/1995 | |
| JP | 06-284654 | * 6/1996 | ............ H03H/3/08 |
| JP | 8-148957 | 6/1996 | |
| JP | 8-239752 | 9/1996 | |

OTHER PUBLICATIONS

F. Engelmark et al.; "Synthesis of highly oriented piezoelectric AlN films by reactive sputter deposition"; 46th National Symposium of the American Vacuum Society, Vacuum, Surfaces, and Films, Seattle, WA, USA, Oct. 25–29, 1999; vol. 18, No. 4, Pt. 1–2, pp 1609–1612; XP002184424; Journal of Vacuum Science & Technology A (Vacuum, Surfaces, and Films); Jul.–Aug. 2000; AIP for American Vacuum Soc, USA.

Naik et al; "Measurements of the bulk, C–axis electromechanical coupling constant as a function of AlN film quality"; IEEE Transactions on Ultrasonics, Ferroelectrics and Frequency Control, Jan. 2000, IEEE, USA; vol. 47, No. 1, PP 292–296; XP002184425.

(Continued)

Primary Examiner—A. Dexter Tugbang
Assistant Examiner—Tai Nguyen
(74) Attorney, Agent, or Firm—Keating & Bennett, LLP

(57) ABSTRACT

A method for manufacturing a thin film is performed such that the internal stress is controlled while the preferred orientation property is maintained at a high value. An AlN piezoelectric thin film is formed on a substrate by a sputtering method using a mixed gas including Ar and nitrogen, wherein the mixed gas has a nitrogen flow rate ratio, that is, nitrogen flow rate relative to the sum of the Ar flow rate and the nitrogen flow rate, of about 10% to about 75%.

7 Claims, 3 Drawing Sheets

OTHER PUBLICATIONS

Akiyama et al; Preparation of highly oriented AlN thin films on glass substrates by helicon plasma sputtering and design of experiments:, Thin Solid Films, Elsevier–Sequoia S.A. Lausanne, CH; vol. 350, No. 1–2; Aug. 15, 1999; PP 85–90; XP004180595.

Okano et al; "Preparation of c–axis oriented AlN thin films by low–temperature reactive sputtering" Japanese Journal of Applied Physics; Part 1(Regular Papers & Short Notes); Oct. 1992, Japan; vol. 31, No. 10, pp. 3446–3451; XP001037814.

R. S. Naik et al.; "Low–temperature deposition of highly textured aluminum nitride by direct current magnetron sputtering for applications in thin–film resonators"; Journal of the Electrochemical Society; Feb. 1999; Electrochem. Soc, USA; vol. 146, No. 2, PP. 691–696, XP002184426.

Ju–Won Soh et al.; "Substrate effects on the epitaxial growth of AlN thin films using electron cyclotron resonance plasma enhanced chemical vapor deposition"; Japanese Journal of Applied Physics, Part 2 (Letters), Nov. 15, 1996; Publication Office; Japanese Journal Appl. Phys, Japan; vol. 35, No. 11B, PP. L1518–L1520; XP001037724.

K S Stevens et al.; "Microstructure of AlN on SI (111) grown by plasma–assisted molecular beam epitaxy"; Applied Physics Letters; American Institute of Physics; New York; US; vol. 65, No. 3, Jul. 18, 1994; PP. 321–323; XP000464829.

* cited by examiner

METHOD FOR MANUFACTURING A THIN FILM

This application is a Divisional of U.S. patent application Ser. No. 09/874,713 filed Jun. 5, 2001 now abandoned.

BACKGROUND OF THE INVENTION

1. Field of the Invention

The present invention relates to a thin film, a method for manufacturing the thin film, and an electronic component. More particularly, the present invention relates to a thin film, for example, a piezoelectric material thin film, a dielectric material thin film, and a magnetic material thin film, or other suitable thin film, used for an electronic component, for example, a piezoelectric thin film resonator, a filter, sensor, and an actuator or other suitable device.

2. Description of the Related Art

Since a resonant frequency of a piezoelectric resonator using a thickness longitudinal vibration of a piezoelectric substrate is inversely proportional to the thickness of the piezoelectric substrate, in the superhigh frequency regions, the piezoelectric substrate must be processed extensively to be very thin. Regarding the decrease in the thickness of the piezoelectric substrate itself, however, in the fundamental mode, several 100 MHz have been believed to be the practical limit of the high frequency due to the mechanical strength and restrictions in the handling thereof.

In order to solve the aforementioned problems, diaphragm type piezoelectric thin film resonators have been suggested, and have been used for filters and resonators. FIG. 5 is a sectional schematic diagram of an example of a conventional piezoelectric thin film resonator. The piezoelectric thin film resonator 1 as shown in FIG. 5 includes a Si substrate 2. A thin film support member 3 having a thickness of several μm or less is formed on the substrate 2 by a partial etching from the reverse surface using a micromachining method. An AlN piezoelectric thin film 5 is provided on the thin film support member 3 as a piezoelectric material thin film including a lower layer electrode 4a and an upper layer electrode 4b on both major surfaces as a pair of excitation electrodes. The thin film support member 3 and peripheral portions thereof thereby define a diaphragm 6. In the piezoelectric thin film resonator 1 as shown in FIG. 5, the thin film support member 3 can be formed to be thin using the micromatching technique, and the AlN piezoelectric thin film 5 can be also formed to be thin by the sputtering, or other suitable process, so that the high frequency characteristics may be extended to several 100 MHz to several 1,000 MHz.

In order to produce resonance characteristics that are superior in the temperature characteristics of the resonant frequency and in the antiresonance characteristics, a piezoelectric thin film resonator as shown in FIG. 6 has been suggested. FIG. 6 is a sectional schematic diagram of another example of a conventional piezoelectric thin film resonator. When the piezoelectric thin film resonator 7 as shown in FIG. 6 is compared with the piezoelectric thin film resonator 1 as shown in FIG. 5, a thin film 8 made of $SiO_2$, $Si_3N_4$, $Al_2O_3$, or ZnO, is formed as the upper layer of the Si substrate 2.

In order to realize the piezoelectric thin film resonators 1 and 7 as shown in FIG. 5 and FIG. 6, the stress of the entire device must be controlled so as not to destroy the diaphragm 6. Since the thin film of $SiO_2$ has strong compressibility, the thin films of $Si_3N_4$ and $Al_2O_3$ have a strong tensile property, and so forth, the internal stress of the AlN piezoelectric thin film 5 must be controlled.

It is said that in order that excellent piezoelectricity to be achieved in the AlN piezoelectric thin film, the C axis is preferably oriented in the direction that is perpendicular to the substrate, and the half-width of the rocking curve is preferably small, as described in, for example, "Acoustic Wave Technology Handbook" written by the Japan Society for the Promotion of Science, 150th Committee on Acoustic Wave Technology issued by Ohmsha, Ltd., 1991. In general, in the case in which the AlN piezoelectric thin film is formed by the sputtering method, an excellent C axis preferred orientation film is produced at a low gas pressure region, that is, at a film generating a pressure of 0.6 Pa or less, as described in, for example, J. Mater. Res., Vol. 12, No. 7, p. 1850 (1997) by A. Rodriguetz-Navarro, W. Otano-Rivera, J. M. Garcia-Ruiz, R. Messier, and L. J. Pilione. On the other hand, since the peening effect is strong at the low gas pressure region, the formed AlN piezoelectric thin film has strong compressibility. Therefore, the internal stress of the AlN piezoelectric thin film has previously been controlled with the gas pressure during the film formation.

When the gas pressure during the film formation is increased, however, the preferred orientation property of the AlN piezoelectric thin film is reduced, and accompanying this, the resonance characteristic is also reduced. As a consequence, the internal stress of the AlN piezoelectric thin film controlled by the gas pressure and the preferred orientation property have a trade-off relationship, so that controlling the internal stress while keeping the preferred orientation property high was not possible.

SUMMARY OF THE INVENTION

In order to overcome the problems described above, preferred embodiments of the present invention provide a thin film and method of manufacturing the same, in which the internal stress is controlled while the preferred orientation property is kept high.

Also, other preferred embodiments of the present invention provide an electronic component including a thin film in which the internal stress is controlled while the preferred orientation property is kept high.

According to a preferred embodiment of the present invention, a thin film primarily including AlN formed on a surface of a substrate is provided, in which the crystallinity is the C axis preferred orientation, the half-width of a rocking curve is about 1.4° to about 1.6°, and an internal stress can be controlled within the range of approximately ±1 GPa.

According to another preferred embodiment of the present invention, a method for manufacturing a thin film includes the steps of forming a thin film according to various preferred embodiments of the present invention by a sputtering method using a mixed gas including Ar and nitrogen, wherein the mixed gas has a nitrogen flow rate ratio, that is, a nitrogen flow rate relative to an Ar flow rate and the nitrogen flow rate, of about 10% to about 75%.

According to another preferred embodiment of the present invention, an electronic component includes a thin film according to preferred embodiments of the present invention.

Regarding preferred embodiments of the present invention, by controlling the nitrogen flow rate ratio of the mixed gas including Ar and nitrogen used in the sputtering method for forming the thin film, the internal stress of the thin film can be controlled without changing the preferred orientation property of the thin film.

Therefore, in the case in which the thin film is mounted on, for example, the piezoelectric resonator, even when the internal stress of the thin film is selected so as to decrease warping and cracking, the effect on the resonance characteristics due to the change in the preferred orientation property of the thin film is minimized.

Other features, elements, characteristics and advantages of the present invention will become apparent from the following detailed explanations of preferred embodiments of the present invention with reference to the drawings.

DETAILED DESCRIPTION OF PREFERRED EMBODIMENTS

Figure 1:
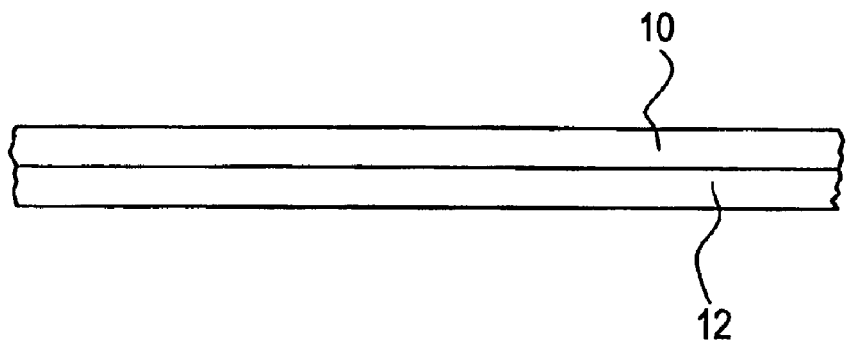
FIG. 1 is a sectional schematic diagram of an AlN piezoelectric thin film according to a preferred embodiment of the present invention.

FIG. 1 is a sectional schematic diagram of an AlN piezoelectric thin film according to a preferred embodiment of the present invention. An AlN piezoelectric thin film 10 as shown in FIG. 1 is formed on a substrate 12 that is preferably made of, for example, Si or other suitable material. In this case, the AlN piezoelectric thin film 10 is formed preferably using an RF magnetron sputtering apparatus including an Al target and using a mixed gas including Ar and nitrogen. In one example of the present preferred embodiment, the AlN piezoelectric thin film 10 is formed at a temperature of the substrate 12 of approximately 100° C., with an RF power of the apparatus of 100 W, and at a nitrogen flow rate ratio of about 5% to about 90%.

Figure 2:
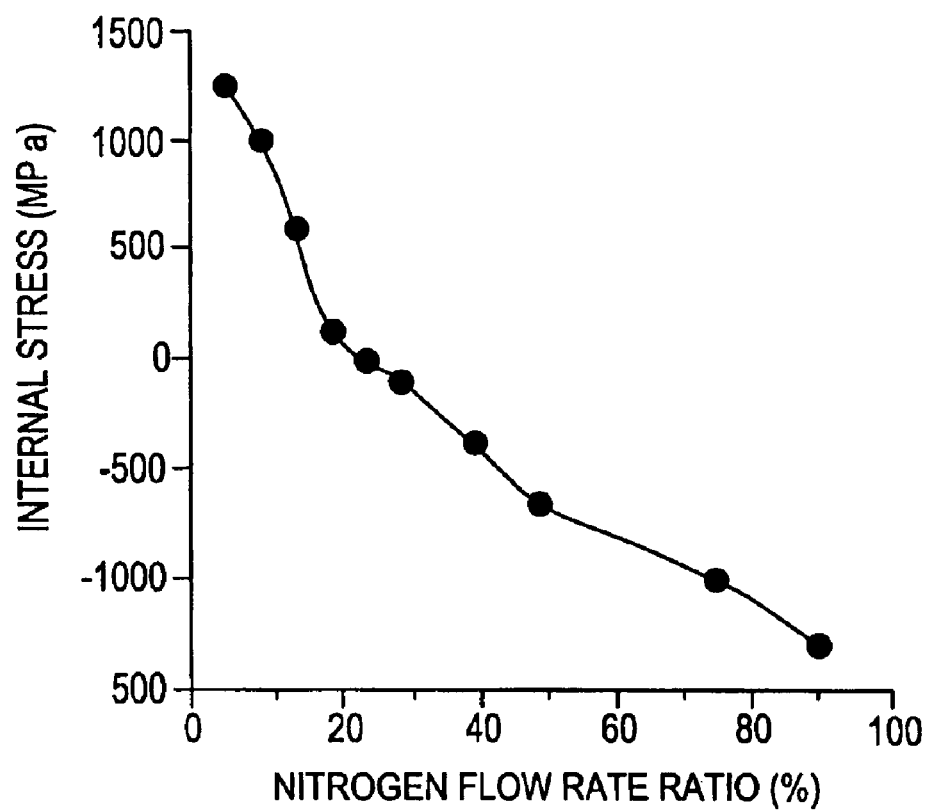
FIG. 2 is a graph showing the dependency of the internal stress of the AlN piezoelectric thin film on the nitrogen flow rate ratio.
Figure 3:
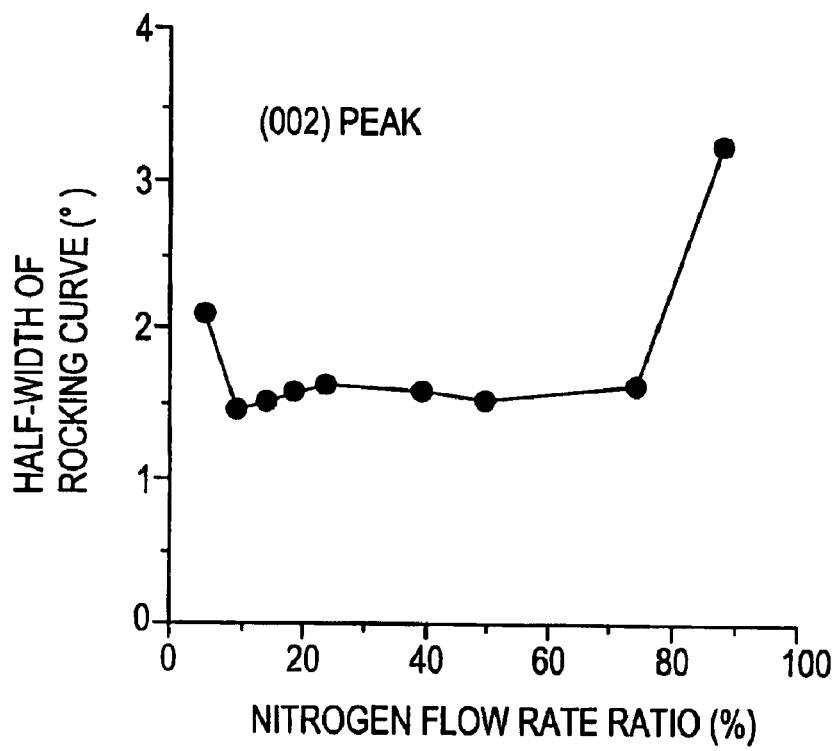
FIG. 3 is a graph showing dependency of the C axis preferred orientation of the AlN piezoelectric thin film on the nitrogen flow rate ratio.

The dependency of the internal stress and the C axis preferred orientation of the AlN piezoelectric thin film 10, formed as described above, on the nitrogen flow rate ratio are shown in FIG. 2 and FIG. 3 with graphs.

The internal stress σ was calculated from the relationship represented by Formula 1 among the warp amount δ of the substrate 12 before and after the formation of the AlN piezoelectric thin film 10, the measurement distance L of the warp amount, the film thickness d of the AlN piezoelectric thin film 10, the Young's modulus E of the substrate 12, the thickness t of the substrate 12, and the Poisson ratio p of the substrate 12.

$$\sigma = 4Et^2\delta/3d(1-p)L^2 \qquad \text{Formula 1}$$

Regarding the C axis preferred orientation, the half-width of the (002) rocking curve of the X-ray diffraction was measured.

As is clear from the graphs as shown in FIG. 2 and FIG. 3, at the nitrogen flow rate ratio of about 10% to about 75%, the internal stress of the AlN piezoelectric thin film 10 can be controlled within the range of about ±1 GPa, while the C axis preferred orientation of the AlN piezoelectric thin film 10 is in a high, stable region of about 1.4° to about 1.6°.

Therefore, in this AlN piezoelectric thin film 10, the internal stress can be controlled, while the C axis preferred orientation is kept high, by controlling the nitrogen flow rate ratio, which is a film formation parameter.

Figure 4:
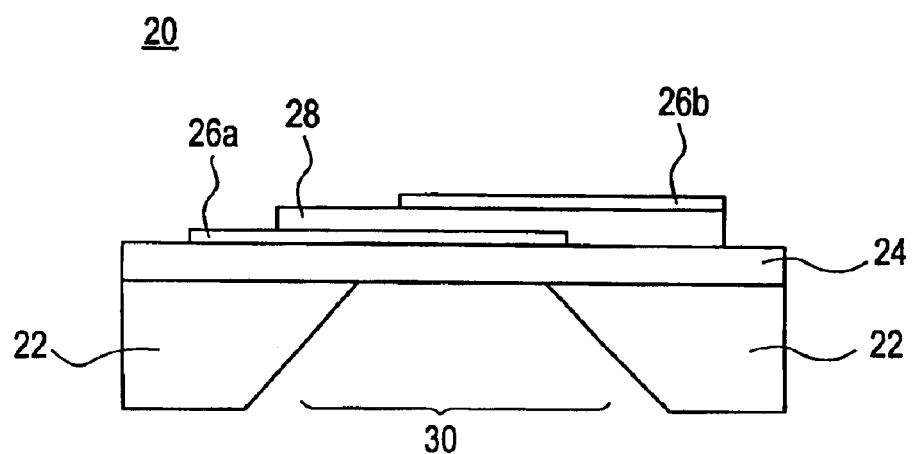
FIG. 4 is a sectional schematic diagram of an AlN piezoelectric thin film resonator according to a preferred embodiment of the present invention.
Figure 5:
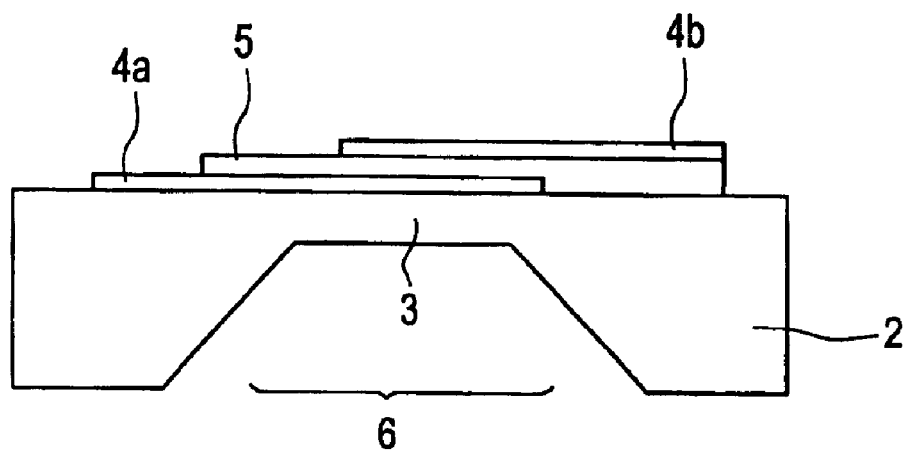
FIG. 5 is a sectional schematic diagram of an example of a conventional piezoelectric thin film resonator.
Figure 6:
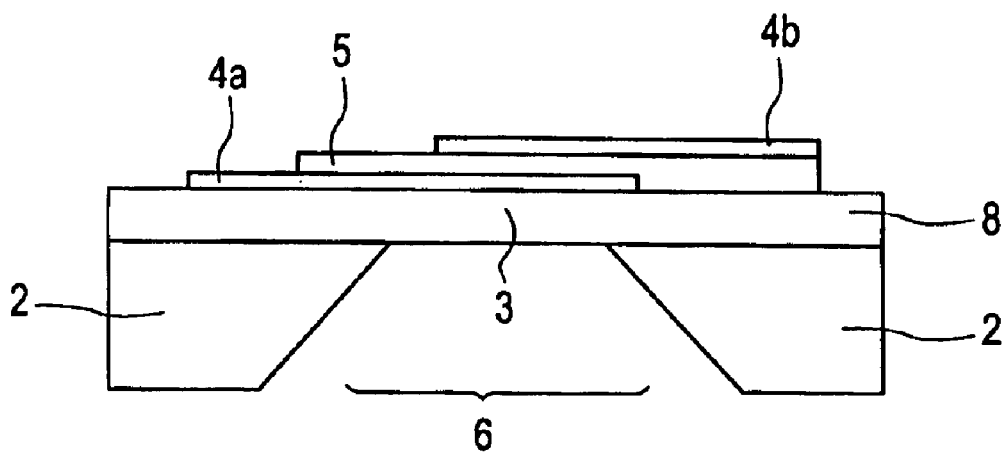
FIG. 6 is a sectional schematic diagram of another example of a conventional piezoelectric thin film resonator.

FIG. 4 is a sectional schematic diagram of an AlN piezoelectric thin film resonator according to another preferred embodiment of the present invention. A piezoelectric thin film resonator 20 as shown in FIG. 4 includes an Si substrate 22.

On the Si substrate 22, a thin film 24 preferably made of $SiO_2$, $Si_3N_4$, or $Al_2O_3$, or other suitable material, a lower layer electrode 26a, an AlN piezoelectric material thin film 28 primarily including AlN as a piezoelectric thin film, and an upper layer electrode 26b are formed in the aforementioned order. In this case, the thin film 24 is preferably formed over the entire top surface of the Si substrate 22. The lower layer electrode 26a is formed on a portion including the central portion on the top surface of the thin film 24. The AlN piezoelectric thin film 28 is formed on the top surfaces of the thin film 24 and the lower layer electrode 26a corresponding to the portion including the central portion of the thin film 24. The upper layer electrode 26b is formed on the top surface of the AlN piezoelectric thin film 28 corresponding to the portion including the central portion of the thin film 24. In this case, the AlN piezoelectric thin film 28 is preferably formed under the conditions which are the same as those existing when forming the AlN piezoelectric thin film 10 as shown in the aforementioned FIG. 1. Regarding the others, the thin film 24, the lower layer electrode 26a, and the upper layer electrode 26b are formed preferably by sputtering, vapor deposition, or other suitable process.

A diaphragm 30 is formed on the substrate 22 by removing the portion thereof corresponding to the central portion of the thin film 24 via anisotropic etching, RIE (Reactive Ion Etching), or other suitable process, from the reverse surface thereof.

In this piezoelectric thin film resonator 20, even when the internal stress of the AlN piezoelectric thin film 28 is controlled to relax the stresses of $SiO_2$ having strong compressibility and $Si_3N_4$, $Al_2O_3$, or other suitable material, having strong tensile property, which are used as the thin film 24, since the change in the preferred orientation property of the AlN piezoelectric thin film 28 is small, stable resonance characteristics, in which the electromechanical coupling coefficient $k^2$ is about 30% or more of the bulk, can be exhibited.

Furthermore, in this piezoelectric thin film resonator 20, the film thickness ratio of the thin film 24 relative to the AlN piezoelectric thin film 28 may be adjusted to improve the resonance characteristics, such as the temperature characteristics of the resonant frequency, although the adjustment of the warp of the diaphragm 30 due to the change in the film thickness ratio can be controlled with the internal stress of the AlN piezoelectric thin film 28.

Therefore, in this piezoelectric thin film resonator 20, even when the internal stress of the AlN piezoelectric thin film 28 is controlled to minimize the warp of the diaphragm part 30, change in the resonance characteristics can be substantially eliminated.

The present invention can be applied to not only the piezoelectric material thin films, but also to other thin films, such as dielectric material thin films and magnetic material thin films, and other thin films.

In addition, the present invention can be applied to piezoelectric thin film resonators as described above, but the present invention can also be applied to other electronic components, such as filters, sensors, and actuators.

According to the present invention, the internal stress can be controlled while the preferred orientation property is kept high in the thin films, for example, the piezoelectric material thin films, used for the electronic components, for example, the piezoelectric thin film resonators.

While the present invention has been particularly shown and described with reference to preferred embodiments thereof, it will be understood by those skilled in the art that the foregoing and other changes in form and details can be made without departing from the spirit and scope of the invention.

What is claimed is:

1. A method for manufacturing a thin film comprising the steps of:

providing a substrate; and forming a thin film on the substrate using a mixed gas of Ar and nitrogen such that the thin film includes an AlN material, wherein the crystallinity is a C axis preferred orientation, a half-width of a rocking curve is about 1.4° to about 1.6°, and an internal stress is within the range of approximately ±1 GPa;

wherein said mixed gas has a nitrogen flow rate ratio of about 10% to about 75%, wherein the nitrogen flow rate is a ratio of a nitrogen flow rate relative to the sum of an Ar flow rate and the nitrogen flow rate.

2. The method according to claim 1, wherein the thin film is formed via a sputtering process.

3. The method according to claim 1, wherein the thin the AlN piezoelectric thin film is formed at a temperature of the substrate of approximately 100° C., with an RF power of about 100 W, and at a nitrogen flow rate ratio of about 5% to about 90%.

4. The method according to claim 1, wherein the thin film is one of a piezoelectric thin film, a dielectric thin film and a magnetic material thin film.

5. The method according to claim 1, wherein the substrate is made of Si.

6. The method according to claim 1, further comprising the steps of forming a thin film made of one $SiO_2$, $Si_3N_4$, and $Al_2O_3$, a lower layer electrode, forming the thin film, and an upper layer electrode arranged in this order.

7. The method according to claim 1, further comprising the step of forming a diaphragm on the substrate.

* * * * *